United States Patent [19]

Cannon et al.

[11] 4,374,429
[45] Feb. 15, 1983

[54] INFORMATION TRANSFER SYSTEM WHEREIN BIDIRECTIONAL TRANSFER IS EFFECTED UTILIZING UNIDIRECTIONAL BUS IN CONJUNCTION WITH KEY DEPRESSION SIGNAL LINE

[75] Inventors: Jack W. Cannon, Boca Raton; Bradley D. Herrman, Pompano Beach; Ramiro Ramirez, Jr., Boca Raton, all of Fla.

[73] Assignee: International Business Machines Corporation, Armonk, N.Y.

[21] Appl. No.: 163,601

[22] Filed: Jun. 27, 1980

[51] Int. Cl.³ .............................................. G06F 3/00
[52] U.S. Cl. .................................................. 364/900
[58] Field of Search ... 364/200 MS File, 900 MS File

[56] References Cited

U.S. PATENT DOCUMENTS

| | | |
|---|---|---|
| 3,795,901 | 3/1974 | Boehm et al. |
| 3,834,616 | 9/1974 | Washizuka et al. ............... 235/160 |
| 4,002,842 | 1/1977 | Meyr et al. |
| 4,064,560 | 12/1977 | Baxter ............................. 364/900 |
| 4,075,691 | 2/1978 | Davis et al. ...................... 364/200 |
| 4,264,984 | 4/1981 | Lovelace ......................... 364/900 |
| 4,295,124 | 10/1981 | Roybal ............................ 364/900 |

*Primary Examiner*—Harvey E. Springborn
*Attorney, Agent, or Firm*—D. Kendall Cooper; John C. Black; J. Jancin, Jr.

[57] ABSTRACT

An information transfer system is described that includes a central processing unit (CPU) interconnected with a peripheral device such as an operator console by an interface bus of finite capacity. Transfer of information in the system is normally in a preferred direction from the CPU to the console. Provision is made to transfer information concerning key depressions on the console from the console to the CPU without using the bus by utilizing a normally continuously operating counter in the CPU that provides a sequence of coded count signals representative of individual keys that are provided on the console and that may be depressed. A comparator in the console compares coded count signals from the CPU counter with coded signals from the console representative of actual key depressions and provides a stop signal to the CPU counter via a single control line when an equal compare of the CPU counter and console coded signals occurs. The stopped coded count condition of the counter represents the actual key depressed. The CPU can then interrogate the current coded count state of the counter in the CPU at a convenient time to determine the actual key depressed and confirm that it has received the key depression information by operating indicators, such as visual and/or audible means in the console thus the interface bus capacity is not impacted by the transfer of the key depression information from the console to the CPU.

8 Claims, 9 Drawing Figures

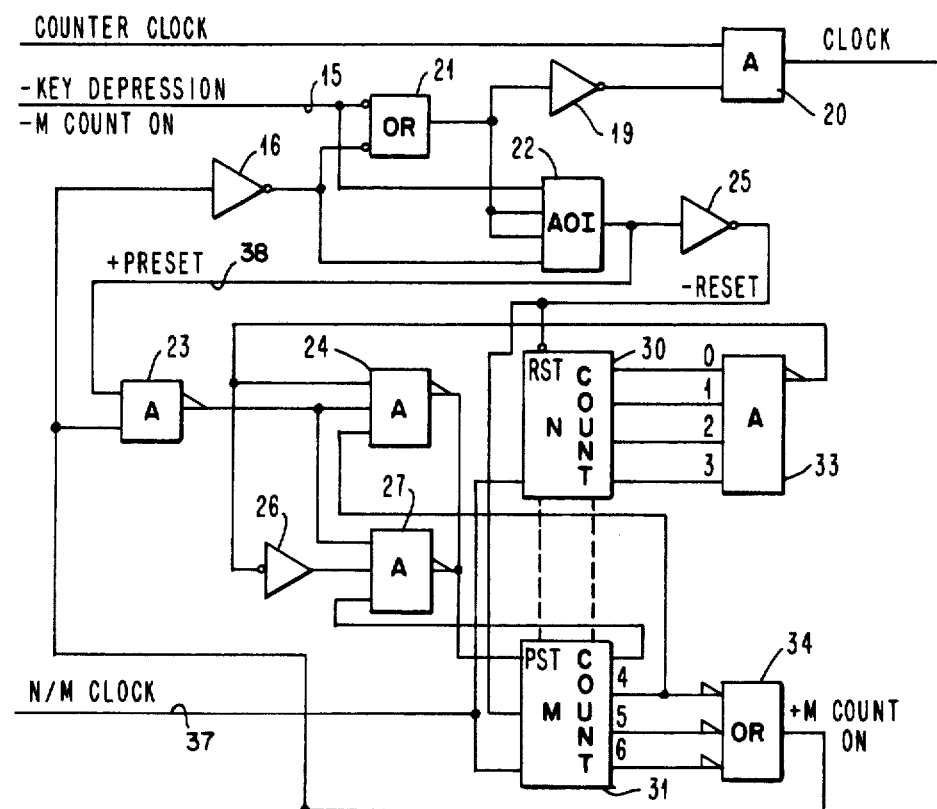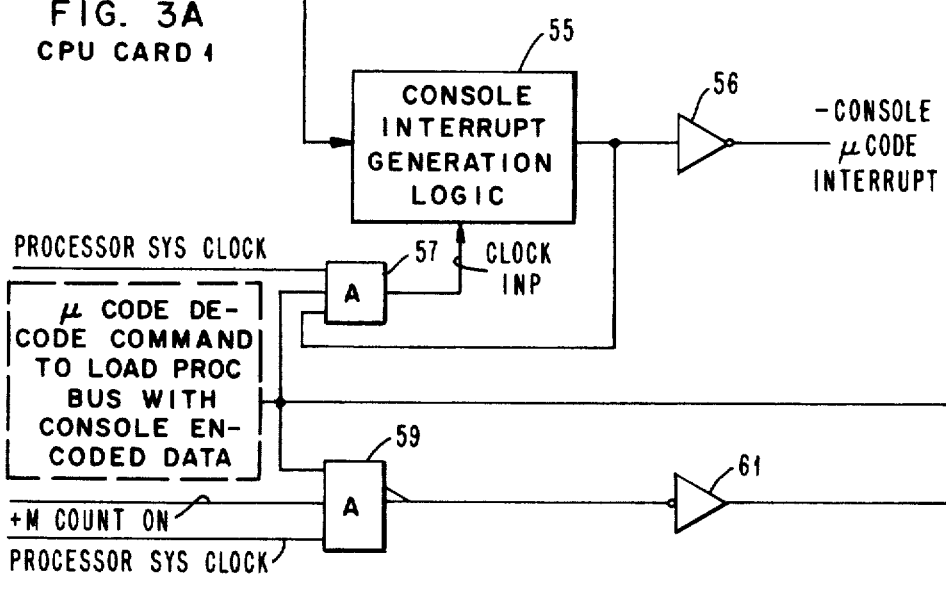
FIG. 3A
CPU CARD 1

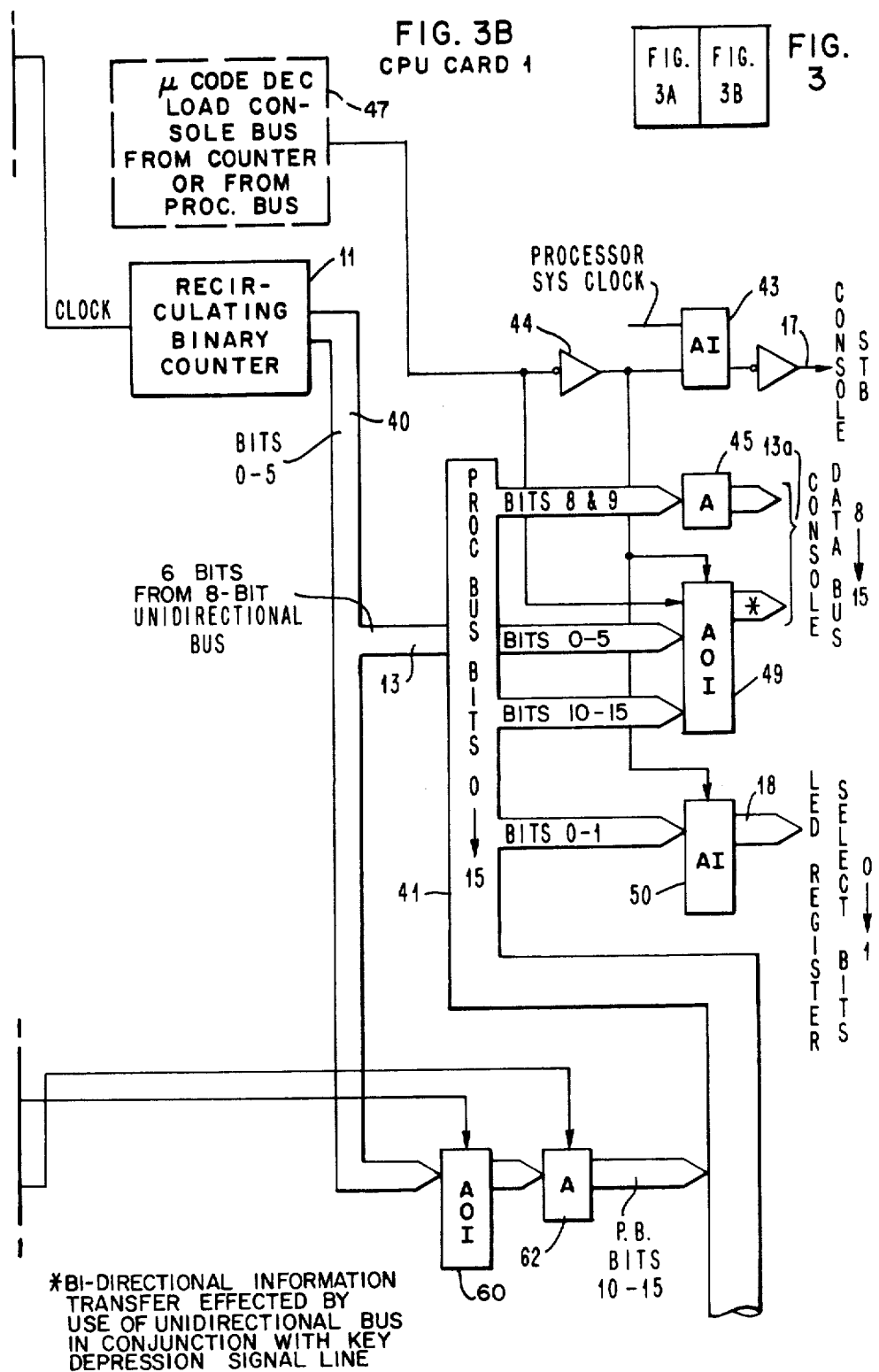

CONSOLE CARD 3

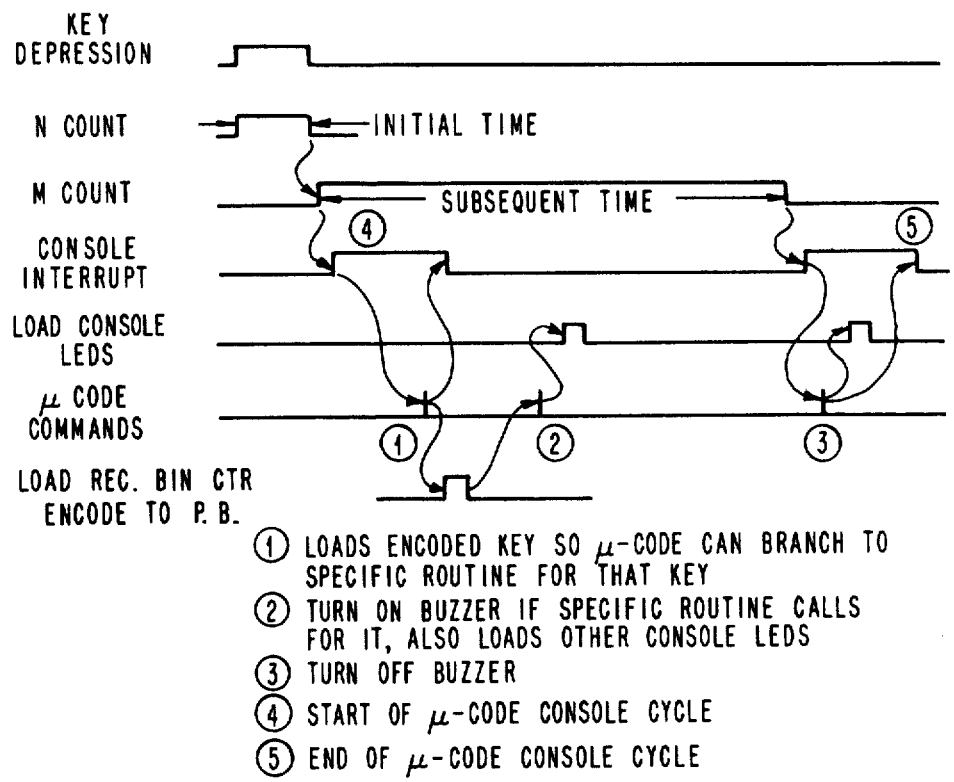
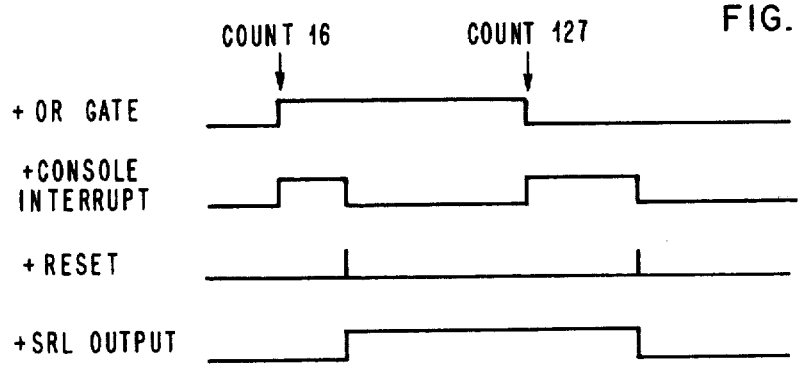

INTERRUPT GENERATOR 55

INFORMATION TRANSFER SYSTEM WHEREIN BIDIRECTIONAL TRANSFER IS EFFECTED UTILIZING UNIDIRECTIONAL BUS IN CONJUNCTION WITH KEY DEPRESSION SIGNAL LINE

BACKGROUND OF THE INVENTION

This invention relates to information transfer systems for data processing systems and more particularly to a more efficient system of this nature having improved performance in relation to the amount of circuitry or pin count required.

Systems of this nature have been described heretofore wherein a central processing unit is interconnected with various subsystems such as storage devices, input/output devices such as printers, or other peripheral devices, the systems predominantly accomplishing transfer of information including data and commands among the various elements in the system by utilizing bus structures that are designed to accommodate the typical data byte or word configuration used in the system. In some cases, fewer transfer lines have been utilized by making use of a serializing/deserializing technique.

In recent years, there has been a trend to increase the density of circuits utilized in data processing systems. This has been accomplished by making use of rather effective technologies such as large scale integration (LSI) or very large scale integration (VLSI) techniques that are known in the art. By using these technologies, the cost of circuits and hence the cost of data processing systems has been considerably reduced.

The advent of processors on a single chip with a multitude of circuits has been a significant development in the past few years. Such a chip has a very high density of circuits in relation to its physical size. Along with that higher density, certain constraints are encountered in a system making use of such a chip in establishing interconnection of the circuits with external devices with which the processor communicates. In order to justify the cost of the chip, it is desirable to utilize as many of the circuits on the chip as possible, or practically all of them, if possible. On the other hand, while the number of pins available on the chip for interconnection to other elements in the system may remain constant, the number of circuits to be interconnected through the pins has greatly increased. It is therefore desirable to utilize the pins that are available in a more efficient manner to handle all of the command and data transfer requirements of the system.

The primary objective of the present invention is to accomplish transfer of data in either of two directions by a more efficient use of the available pins on a processor chip or card.

SUMMARY OF THE INVENTION

In accordance with the present invention, a single direction bus from a central processing unit (CPU) to an operator console or similar unit in conjunction with a single control line connected from the console to the CPU and activated upon key depressions are utilized for the transfer of data in either of two directions between the central processing unit and the operator console. The central processing unit has facilities for processing digital data and for responding to digital data input signals and supplying digital data output signals to acknowledge by means on the console of indicators or similar means any entry made by the operator at the console.

In the practice of the present invention, a significant reduction in the number of input/output pins is realized by making use of the techniques described.

In the preferred embodiment described, bidirectional communication of digital data is established between a CPU and an operator console. The digital data is represented by coded characters, each character comprising a predetermined plurality of binary digital signals transferred in parallel in the system. Transfer of the digital data is in both an output direction from the central processing unit to the operator console and in an input direction from the operator console to the central processing unit. A keyboard unit having an array of entry keys is ordinarily provided for use by the operator to enter information and visual and audible indicators are used to transmit advisory status information to the operator as required during operation of the system. Thus, a bidirectional information transfer capability is required.

For a better understanding of the present invention, together with other and further advantages and features thereof, reference is made to the description taken in connection with the accompanying drawings, the scope of the invention being pointed out in the appended claims.

BRIEF DESCRIPTION OF THE DRAWINGS

Referring to the drawings:

FIGS. 3A and 3B when arranged as shown in FIG. 3 the detailed interface circuitry for the processor.

FIG. 5 illustrates timing relationships involved in information transfer during operation of the system.

FIG. 7 is a timing chart for the circuit of FIG. 6.

ABBREVIATIONS

The following abbreviations are occasionally used herein:

| Abbreviation | Definition |
| --- | --- |
| (a) Processor | |
| A | AND Circuit |
| AOI | AND or Invert Circuit |
| AI | AND Invert Circuit |
| Counter CLK. | Recirculating Binary Counter Clock Input at a Selected Frequency |
| N COUNT | N Counter Represents an Initial Count Interval of a Selected Number of Milliseconds |
| M COUNT | M Counter Represents a Subsequent Count Interval of a Selected Number of Milliseconds |
| PST | Preset Signal |
| RST | Reset Signal |
| CLK. INP. | Clock Input of Frequency of 1 Kilohertz |
| N/M CLK. | N/M Clock |
| PROCESSOR SYS. CLK. | Processor System Clock |
| CONSOLE CODE INTERRUPT | Console Microcode Interrupt |
| P.B. BITS | Processor Bus Bits |

-continued

| Abbreviation | Definition |
|---|---|
| * | Bidirectional Information Transfer Effected by use of Unidirectional Bus in Combination with Single Control Line activated upon Key Depression |
| STB | Strobe |
| (b) Console | |
| LED's | Console Light Emitting Diodes |
| COLUMN 0-11 | Columns and Rows Formulate the XY |
| -ROWS 0-3 | Matrix of the Key Matrix |
| (c) Timing Chart, FIG. 5 | |
| CONS. | Console |
| LD REC. BIN. | Load Recirculating Binary Counter |
| CTR. ENCODE TO P.B. | Code to Processor Bus |
| (d) Timing Chart, FIG. 7 | |
| +SRL output | Shift Register Latch output |

DETAILED DESCRIPTION OF BIDIRECTIONAL INFORMATION TRANSFER SYSTEM

Figure 1:
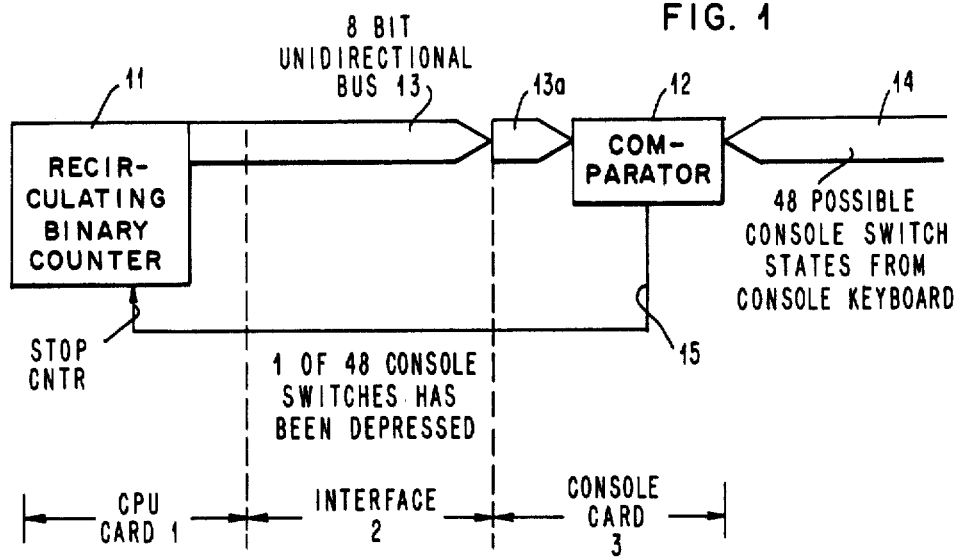
FIG. 1 is a system diagram illustrating the central processing unit, the console unit and various interface relationships in the system.

The bidirectional information transfer system wherein bidirectional information transfer is effected by utilizing a single direction bus and a single control line activated when a key depression is recognized will now be described. As indicated, the system in the preferred embodiment utilizes a processor that is interconnected with a console for communication of information back and forth between the processor and an operator of the system. FIG. 1 is a block diagram of the information transfer system utilized in the present system and illustrates in a general way the relationships of various elements in the system. The diagram of FIG. 1 is generally divided into three sections, the leftmost section representing elements that are found on the central processing unit card, the central portion illustrating the interface elements, and the rightmost portion illustrating elements located on the console card.

It is evident that other elements are required for normal operation of a system of this nature. However, in order to simplify the description, only those elements of primary importance in the practice of the invention are illustrated in FIG. 1, and the detailed circuits are shown in other figures. In FIG. 1, the elements include a recirculating binary counter 11 that is incorporated on the CPU card, a comparator 12 that is located on the console card having several inputs including information provided by way of an 8-bit unidirectional data transfer bus 13 having a related continuing portion 13a on the console card. Due to the output requirements of the system, data transfer bus 13 (and portion 13a) is used exclusively for transmission of data in an output direction from the central processing unit to the operator console thus precluding the availability of the data transfer bus for transmission of data in an input direction from the operator console to the central processing unit. Only 6-bits of bus 13 are directed to comparator 12. Bus 14 comprises a key entry bus means that provides signals which represent any one of the forty-eight console key entry switches, such signals resulting from the depression of keys on the console keyboard. During operation of the system and in accordance with the principles of the present invention, certain signals are provided by way of a single line 15 from comparator 12 to the recirculating binary counter 11. Line 15 represents the particular one of a number of console switches that has been depressed.

Figure 4:
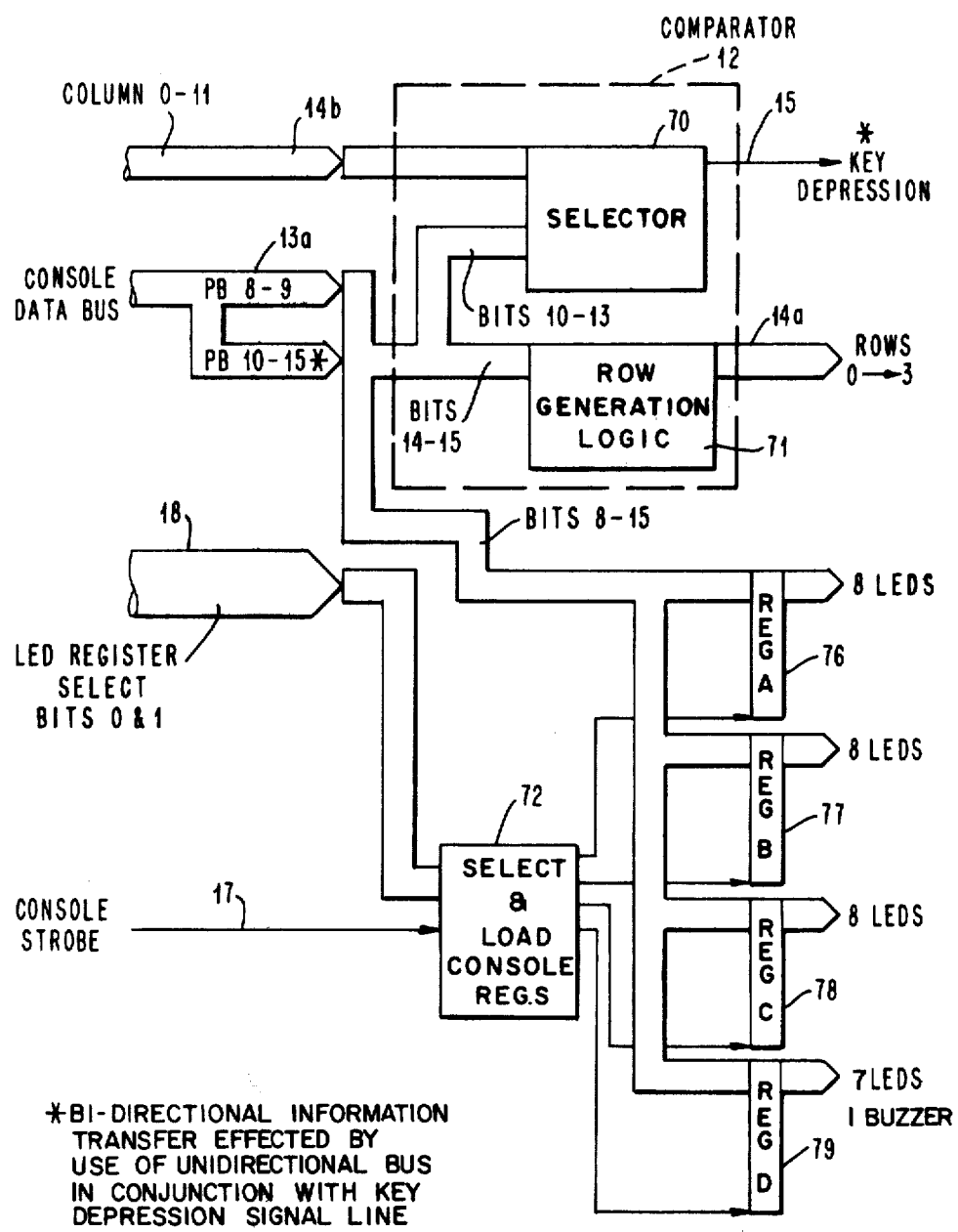
FIG. 4 illustrates the detailed interface circuitry for the console.

The console 3 provides bidirectional communication between the processor card 1 and the operator console. Detailed circuits of the processor, the interface, and the console are shown in FIGS. 3A, 3B, and 4. Generally speaking, light emitting diodes (LED) and a buzzer are used to transmit advisory visual and audible data to the operator while an elastic diaphragm switch (EDS) keyboard unit having an array of entry keys is used to receive switch depression data from the operator. This dictates a bidirectional data transfer capability on the central processing unit to console interface. The LED's are driven by console logic which contains latching registers whose function is to maintain the appropriate polarity necessary to keep the respective LED's in a continuously "ON" or "OFF" state. These registers are loaded from the 8-bit unidirectional bus 13a plus one dedicated strobe line generated by the CPU logic.

Six of the data out bus lines are used to sample the EDS keyboard array for a switch depression. Since the time required to load data into the LED (and buzzer) registers is typically only about 150 nanoseconds, these six lines normally are available for switch sampling data.

The CPU card 1 generates a count sequence of 6 bits of encoded switch sampling data. These codes are generated by the recirculating binary counter 11 operable in a count mode and a stop mode and which in a count mode is continually being incremented at a relatively high frequency. The counter outputs drive the unidirectional processor data bus 13 and console data bus 13a connecting the CPU card 1 with the console card 3.

Four of the 6 bits (bits 10-13) of encoded data are compared to the column outputs of the keyboard by the selector portion 70 of comparator 12 residing on the console card 3. Two of the bits (bits 14 and 15) are used by way of logic 71 to generate Rows 0-3 signals to the keyboard. The output of comparator 12 on console card 3 drives the single bit response line 15 which is routed back to the recirculating binary counter 11 on the CPU card 1.

On the keyboard, there are typically 48 switches. Six bits of encoded data allow for 64 corresponding switch codes. After a console switch has been depressed, the console comparator 12 output goes active, when binary counter 11 on the CPU card 1 generates the matching counter code data. The console comparator output becoming active on line 15 stops counter 11 and is notification to the CPU that one of the 48 console switches has been depressed. An equal compare of the 6-bit row/column address of the depressed switch and the 6 bits represented by counter 11 occurs before the comparator output on line 15 becomes active. Although counter 11 is being incremented at a relatively high frequency, it is still sufficiently slow enough to allow enough time for the comparator output to get back to the CPU before the counter increments from the current count state.

The console card comparator 12 active output signal on line 15 is used to stop the binary counter 11 on the CPU card. This stops the count of counter 11 at the same code which matches the row and column outputs of the console keyboard.

With this remote information residing in the CPU itself, the CPU is able to deduce from the current code state of counter 11 (now stopped) which switch has been depressed on the remote console keyboard therefore eliminating the need for the console card to transmit such data back to the CPU across the interface.

If the comparator output on line 15 stays inactive, this is an indication to the CPU to allow counter 11 that is generating the codes to continue to run freely. The CPU then ignores the data residing in the counter generated codes.

The system effectively reduces the total number of signal cables connected between the console and processor. Only one signal cable is needed compared to three or more cables that might be required for other processors. A corresponding reduction in module I/O pins is also achieved.

DATA TRANSFER BUS AND CONTROL SIGNALS

Figure 2:
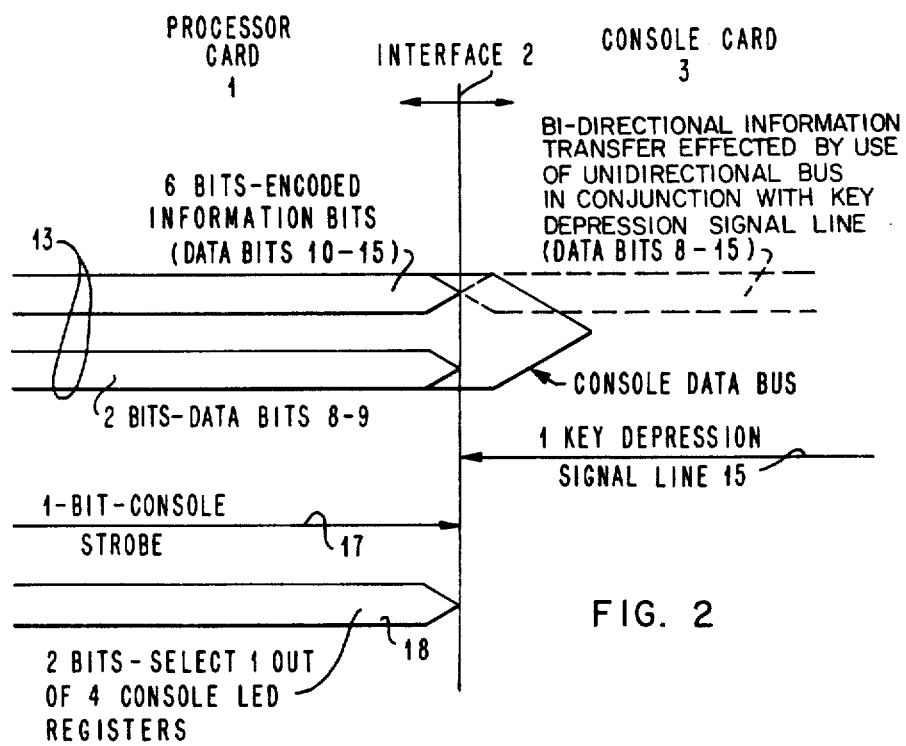
FIG. 2 illustrates the interface cable configuration used in the present invention.

FIG. 2 represents relationships of the data transfer buses in the system as well as certain of the strobe and signal lines utilized in the system.

The diagram of FIG. 2 shows the unidirectional processor data bus 13 and console data bus 13a comprising 8 data bit lines. Eight of the lines 8-15 are used for loading of the LED registers A-D shown in FIG. 4. Six of the lines designated 10-15 are used as an input to the comparator 12 in FIG. 4. Register D has 7 LED outputs and 1 buzzer output. Shown in phantom in the upper right portion of FIG. 2 is another representation of the unidirectional information bus to illustrate the point that the data provided on this bus is used in conjunction with a key depression to provide an indication to the processor of the particular key depressed. A signal is actually provided to the processor from the console by way of the key depression signal line 15. Another signal line of interest is the console strobe line 17 that controls the time that the LED registers are loaded. Two bits from the processor designated 18 are used to select the particular one of four possible LED registers for loading.

CPU Card 1—Counting Action and Recognition of Key Depression

FIGS. 3A and 3B (arranged as shown in FIG. 3) illustrate the detailed circuits of the CPU card 1 that are involved in the data transfer arrangements in accordance with the present invention. Certain of the elements previously discussed in conjunction with FIG. 1 are also shown in FIGS. 3A and 3B. These include the recirculating binary counter 11, 6-bits of the 8-bit unidirectional bus 13 which is actually part of the interface, and the key depression signal line 15.

The recirculating binary counter 11 is driven by a fixed counter clock frequency of several hundred kilohertz. This frequency is normally applied to the recirculating binary counter 11 through AND gate 20. The purpose of AND gate 20 is to allow the counter 11 to be able to be stopped in selected count states when the key depression line 15 becomes active or when the maximum Count of which M counter 31 is capable of achieving is actually achieved as represented by an output from block 34. It is important to stop counter 11 when a key depression occurs so that the proper switch is interrogated during the time it is depressed. It is also important to continue to interrogate that same switch for a short time after it is released in order to prevent multiple responses due to slow or erratic switch releases. It is for this purpose that when M counter 31 reaches its maximum count this is also used to stop the counter 11. The M count is inverted through inverter block 16 in such a manner that it can be OR'ed in block 21 with key depression line 15 and then inverted again by block 19, to provide control on block 20 for stopping the actual counter clock from incrementing the recirculating binary counter. At this time, the status of recirculating binary counter 11 will contain a count which would correspond to some particular switch which has been depressed on the console. The OR block 21 is used in conjunction with AOI block 22 to form an Exclusive OR circuit wich allows reset and/or preset controls to the N counter block 30 and M counter block 31.

The N counter block 30 and the M counter block 31 operate in a cooperative fashion in a manner comparable to that described in the article entitled "Time Duration Detector and Encoding Apparatus for Low-Cost Switching Systems" by J. W. Cannon that appeared in the IBM Technical Disclosure Bulletin of January 1977 at pages 2840-2844.

As explained in that article, mechanical switches can only be actuated at certain maximum frequencies. For example, a single human finger is restricted to approximately six depressions per second (1000 m.s. 6=approximately 160 m.s.) and actual depression time on an EDS keyboard of a first minimum period of time such as approximately 35 m.s. minimum. Therefore, one can assume that any components of a switch output that do not meet a minimum continuously on time of 35 m.s. and a minimum continuously off time of 125 m.s. (160 m.s.-35 m.s.) can be rejected as an invalid input and consequently ignored. It is primarily the on-time stipulation that rejects the glitches and the off-time stipulation that rejects multiple entries due to human jitter and/or slow switch release times. A switch output (voltage versus time) is graphically represented in the articles. An "N" count represents the minimum switch on time. An "M" count represents the minimum switch off time. The switch activated must display an uninterrupted on condition for some time greater than "N". Conversely, the switch must also display an uninterrupted off condition for some time greater than "M".

In the present instance, N and M counts are derived from a single binary counter, comprised of low order binary counter 30 and high order binary counter 31. The N count is the initial time interval, that is, the minimum on time used to validate the detection of a key depression. In this case, this time is approximately 16 milliseconds, rather than 35 milliseconds as discussed in the article. The M count is the recovery time interval that is, the minimum off time used to invalidate key depression detection occurring upon a keyswitch release. In this case, this time is approximately 112 milliseconds, rather than 135 milliseconds as discussed in the article. See FIG. 7, count 128−count 16=count 112. Once the N count time interval is reached by counter block 30, referred to as "an overflow", as indicated by all lines active and an output from And circuit 33, the, M count time interval kept track of by counter block 31 begins. The maximum M count time is defined as any high-order bit on and is detected by OR block 34. The first time the N count is reached by counter block 30 validates the key depression an all N count overflows increment the M counter 31.

Once an initial key depression has been sensed through line 15, the output of block 22 is used to feed inverter block 25 in which case the reset feeding N and M counter 30 and 31, respectively, is then relieved and those counters are allowed to increment. Once the M count has been achieved, its output through OR gate block 34 then becomes active and changes the state of the Exclusive OR circuit, blocks 21 and 22, so that the count in each counter is then frozen and will remain that way until the signal on the key depression line 15 goes away. This means that the M count is essentially frozen as long as the operator holds a finger on the console keyboard. Once the operator's finger has been released from the keyboard, the key depression line goes inactive; however, the M count is still on and at that point the Exclusive OR output of block 22 then changes states, allowing the reset to be relieved and the incrementing of the N/M counter comprising blocks 30 and 31 then proceeds. The N count and the M count, blocks 30 and 31, respectively, are incremented by clock signals on the N/M clock, clock line 37, FIG. 3A, having a frequency typically in the neighborhood of one kilohertz. Control of these counters is accomplished through gating of AND block 23, inverter 26, AND block 24, and AND block 27 to allow the presetting of the M clock. Logic gates 23–27 are arranged in such a manner that once the N count is achieved and the key depression switch goes away, then the M count will start to increment, and it will try to increment as long as there is no key depression signal coming in to OR gate block 21. If, during this time, an additional input is received on key depression line 15, a momentary preset will be applied to the M counter by way of AOI block 22, + Preset line 38, and And circuits 23 and 27 and it will start over from a basic count modulus of 16 (maximum count of N counter). A check is made to see if the key depression line has remained inactive for a length of time equal to the M count multiplied the N count output frequency, N Count outputs are supplied to block 33 and at overflow time an output from block 33 will occur, thus changing the gating to blocks 24 and 27, respectively. Ultimately, M count 31 will reach its maximum count, that is, overflow, as indicated by output by way of block 34. Following this, both counters will be reset from AOI block 22 and Invert block 25.

When the M count is initially detected at the output of OR gate 34, it causes an interrupt to be produced in console interrupt generation logic 55. This is driven through inverter block 56 to create a console microcode interrupt which in turn tells the processor that a key has been depressed and it has remained depressed for a sufficient length of time to take care of any switch bounce problems and that the CPU can then issue a command to read the recirculating binary counter which it does through AOI block 60.

Operation of Console Interrupt Generation Logic

Figure 6:
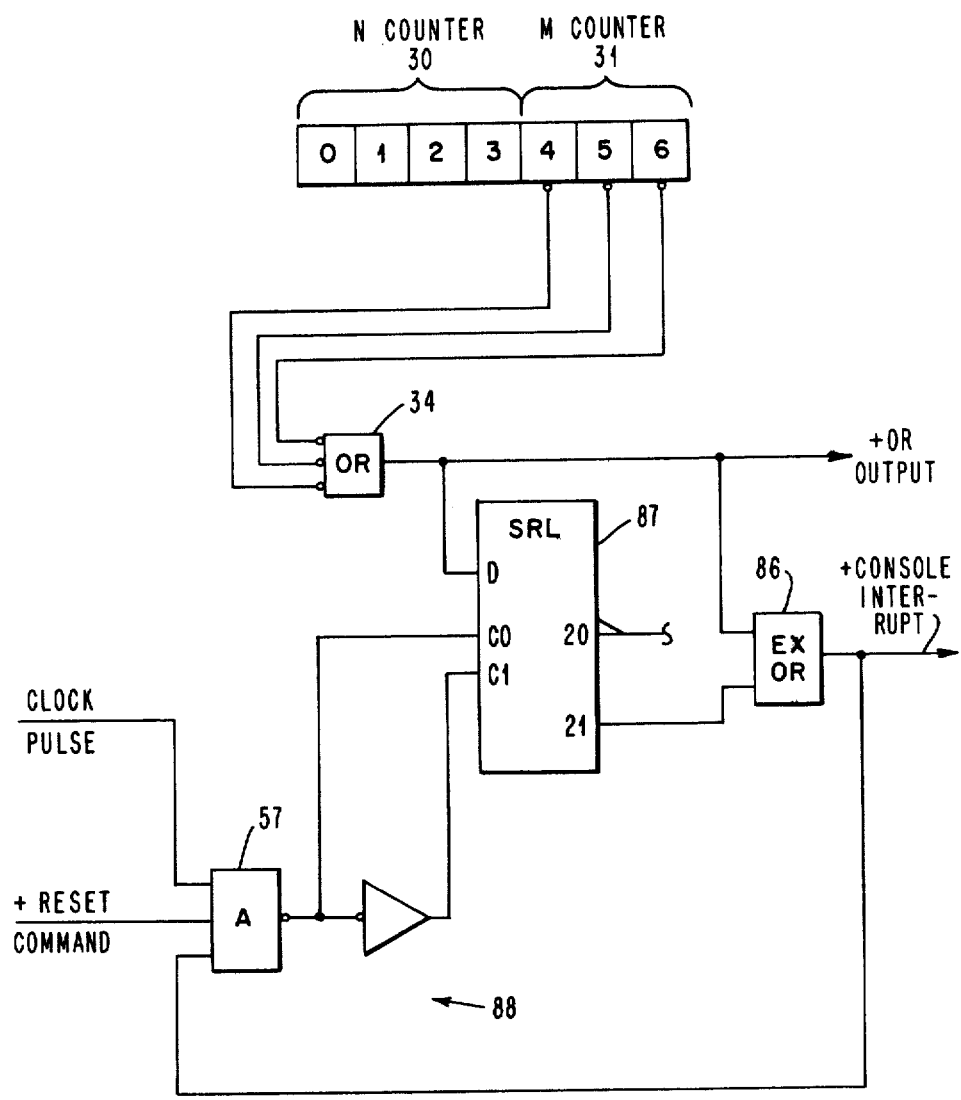
FIG. 6 illustrates an interrupt generator circuit that is useful in the present system, where

Reference is made to FIGS. 6 and 7 which relate to the console interrupt generation logic 55. Counters 30 and 31 are also shown in FIG. 6 for convenience. This logic operates as follows.

The interrupt request generator circuit of FIG. 6 includes a detection arrangement to allow microcode control of the console buzzer upon depression of a key on the operator console. The console buzzer is first activated when a key depression is detected and then the buzzer is deactivated 112 milliseconds after the key depression is released. Both activation and deactivation of the buzzer sound is controlled by the CPU. Since CPU intervention in buzzer operations seldom occurs, the console notifies the CPU by means of an interrupt signal.

To generate an interrupt that signifies at one time "turn on the buzzer" and at a different time "turn off the buzzer", the hardware generates the interrupt with logic that detects transitions. The hardware consists of control logic, FIG. 6, used in conjunction with binary counters 30 and 31. A latch is provided which generates an interrupt request when the latch comes "on" and again when it goes "off".

The counter comprises seven (7) stages. Each count is one millisecond of time. The counter increments from zero to 127. The counter function is to generate a 112 millisecond pulse. The leading and trailing edges of the wide pulse are used to keep the buzzer sound for 112 milliseconds after the key depression is released by way of console Interrupt and CPU control signals. This technique makes the buzzer audible to the user when a very quick switch depression occurs on the keyboard.

Besides counters 30 and 31, the circuit consists of an Exclusive OR (Ex-OR) gate 86, a polarity hold shift register latch 87 (SRL) having a gated system clock input at 88, and one "Negative OR" gate 34 that serves to OR the three high-order minus outputs which are derived from counter 31. The output of OR gate 34 provides data inputs to both the SRL latch and the Exclusive OR circuit 86. The other input to circuit 86 is the positive output of the polarity hold SRL 87.

The output of Exclusive OR 86 drives the console interrupt line 90 directly. The output is active whenever the OR'ed output of counter 31 is different from the SRL output. If the OR'ed output and SRL output are identical, the gate 86 is inactive, meaning the console interrupt line 90 is inactive.

The SRL output follows the OR gate 34 output when the SRL system clocking occurs. The output from gate 86, which is the console interrupt signal, is reset when clocking occurs. When clocking the SRL latch 87, the polarity hold will latch the output data value from OR gate 34.

The SRL clocking is enabled when two conditions exist simultaneously. A microcode command must be issued while the console interrupt line 90 is active. A single clock pulse will occur within the envelope of the reset command decode.

Before a key depression occurs and for the hardware to operate properly, the console interrupt and buzzer must be both off and the counters 30 and 31 must be initialized at a starting count of zero. When a key depression first occurs, counters 30 and 31 are allowed to begin counting from zero. The counters are designed to count only as long as the key is depressed or the count is at a state equal to or greater than 16. When the count reaches 16 because the switch has remained depressed, this is proof to the processor logic the key depression was intentional and to signal the processor to turn on the buzzer that is presently off.

When the sixteenth count is reached, the first of the bit positions of counter 31 goes active. The transition from the output of OR gate 34 causes a console interrupt by way of line 90. The data stored in the SRL latch 87 becomes different from the output of OR gate 34. The SRL has the past value when all the high-order bits were inactive. The sequence is illustrated in FIG. 7.

The console interrupt becoming active causes the microcode to issue a Reset. The Reset command will clock new "OR" value data into the SRL latch 87 which will clear the interrupt. When the console interrupt is reset during a count between and including 16 to 127, the processor will be sent data identifying and confirming which switch was depressed. The processor, on receiving that kind of switch identifying type data, will know to turn on the buzzer.

The Reset command is issued before count 127. If not, the interrupt signal will turn off when the last high-order bit goes inactive. However, a minimum of 112 milliseconds is plenty of time for the processor to easily service the interrupt.

After count 127 is reached, the binary counters 30 and 31 will stop incrementing. None of the three-bit positions of counter 31 will be active. The binary count will be frozen at zero until the next key depression.

When the binary counters go from count 127 to zero, a console interrupt is generated. The OR gate 34 transitions to inactive level since all high-order bits are off. The output of SRL latch 87 would be active since it was last clocked when at least one of the high-order bits was on. The Exclusive OR gate 86 detecting the difference will generate an interrupt signal, FIG. 7.

Processing of Console Interrupt

To service the interrupt, the microcode will issue its reset. When a reset of the console interrupt occurs outside the count of 16 to 127, the interface circuitry will gate a code to the CPU that does not correspond to a switch existing on the keyboard. This type of data means that no key depression is detected and will turn off the buzzer.

When a microcode command is decoded within this interface circuitry, block 59 will respond to such a decode if the M count is on. At that time, it is inverted through block 61 and controls the gating of block 62. Therefore, if a microcode interrupt has been posted through block 56, a subsequent microcode command to read the counter results from block 11 is issued and if the M count is on, block 11 is fed through blocks 60 and 62 to actually stimulate the processor bus. This same microcode command to read the binary counter is also fed through AND gate 57 to reset the interrupt posted through the logic in block 55. Once the M count goes off, which is synonymous to the N count also going off, then another interrupt is posted from block 55. As a result of this interrupt, another command is issued by the processor which is not able to propagate through AND gate 59 because the M count is off. This in turn results in no gating out of AND gate 62 to the processor bus. In other words, some time after the key has been released, another microcode interrupt would be posted, but no bits are read out. This is a signal to the processor that the key has been released and that if any buzzers are on, then those buzzers can be turned off.

The 6-bit output of the recirculating binary counter 11 is on bus 40 and is fed to a 6-bit portion of the unidirectional bus 13a through AOI circuit 49. These bits would always be active and are continuously being incremented in order to scan the row/column matrix of the keyboard. To present LED information across this bus, AOI circuit 49 selects processor bus bits 10-15 instead of binary counter bits 0-65 on bus 40 in order to load respective LED registers illustrated in FIG. 4, block 76-79. At the same time that bits 10-15 are being fed through AOI circuit 49, two additional high-order bits 8 and 9 are gated through AND block 45. These two bits are added to comprise an 8-bit data bus which in turn is necessary for loading of previously mentioned registers 76-79. The selection of whether or not the binary counter output is being directed to the interface bus or processor bus bits are being directed is made through a particular microcode command from the CPU whose presence is reflected from block 47, FIG. 3B, through inverter block 44 which in turn will select either the processor bus bits 0-5 on bus or the binary counter bits 40. There is a total of 32 LED's on the console to be written. In order to determine which bank of registers is selected, two additional bits are necessary to determine to which one of four possible registers the eight data bits must be ultimately directed. These bits come from processor bus 41 and the actual bit numbers are zero and one which are gated through AND block 50 to feed the subsequent high-order LED register select bits, zero through one.

Console Card 3

The details of the console card, particularly as they relate to the data transfer arrangements of the present invention, are illustrated in FIG. 4. Included in this figure are certain elements that were previously discussed in conjunction with FIGS. 1 and 2. These are the comparator 12, the key depression line 15, the data bus 13a, the console strobe line 17, and the LED register select bits line 18.

The comparator 12 is comprised of selector 70, and row generation lock 71. The row generation logic is fed by the two low-order bits of the console data bus which, in turn, ultimately are fed by the recirculating binary counter 11 from FIG. 3B. These two bits 14 and 15 drive a one-of-four output from row generation logic 71. Depending on the particular state that this two-bit binary code is in, then one of four possible rows will be driven on the keyboard matrix. When one of those rows are driven, then another block, selector 70, will be stimulated by four bits 10-13 and one of the twelve possible columns will be selected thereby providing an output from selector block 70 to drive the key depression line 15. Thus, depending on the state of the 6-bit binary counter 11, on FIG. 3B, a particular row will be stimulated which, if it corresponds to a matrix position on a particular column which is also selected, then once a key is depressed, and the counter value is equal to its corresponding position on the console, then the key depression line will become active at this point. This, in turn, is fed back to OR block 21, FIG. 3A, and controls the stopping of counter 11 and subsequent debouncing requirements for the key itself through the M and N count blocks 30 and 31 of FIG. 3A. To load LED's, then bits 8-15 of console data bus 13a are fed to one of four possible registers 76-79. The one-of-four selection is accomplished through select and load console registers logic 72 which receive two bits 18 that control the one-of-four selection. Also, console strobe 17 is utilized as a timing strobe to route itself through one of the four possible registers selected by register select bits 18. The purpose of registers 76-79 is to retain this data so that a continuous current source is ultimately provided to the LED's (and buzzer) as a result of the output from their corresponding register 76-79.

Data Transfer Timing Relationships

FIG. 5 depicts timing relationships that typically occur when a key is depressed and subsequently the LED's are turned on to provide the operator with his required feedback. The first line in FIG. 5 is the actual key depression line. Once the key has been depressed, the N count becomes active. If a key is depressed for a sufficient time such that the N count actually expires and its initial time met, then that sequence of events will start the M count to running. If the key depression goes away at this time, then the M count will actually start. As soon as the M count starts, a console interrupt is posted. This signals the start of the microcode cycle for the console. The microcode will respond with a command that will reset the console interrupt and in turn load the recirculating binary counter 11 from FIG. 3B onto the processor bus so that the CPU will be able to recognize the specific key that has been depressed. After the processor recognizes the specific key which has been depressed, it will issue another microcode command to turn on any required LED's and/or buzzer. This sequence of events takes place very rapidly in relationship to the subsequent time interval of the M count. Eventually, the M count will expire after some subsequent time following the key depression line going inactive. When this occurs, another console interrupt is posted and the buzzer is turned off by way of the load console LED's command. As a result of this command, the console interrupt is also disabled and this signals the end of the microcode cycle.

While a preferred embodiment of the invention has been illustrated and described, it is to be understood that there is no intention to limit the invention to the precise construction herein disclosed and the right is reserved to all changes and modifications coming within the scope of the invention as defined in the appended claims.

We claim:

1. An information transfer system, said system utilizing digital data to represent information, said digital data being represented by coded characters, said system incorporating a central processing unit having facilities for processing said digital data and for supplying digital data processor output signals indicative of status information and the like and responding to digital data input signals in said system, and said system requiring transfer of said digital data in both an output direction from said central processing unit and in an input direction to said central processing unit, said central processing unit having a processor bus for transferring digital data in said system, said system comprising:

a device externally located from said central processing unit, said device being activatable to selectively provide a predetermined number of distinct digital data signals for input to said central processing unit and said device further comprising a selectively operable advisory unit, said advisory unit being responsive to digital data output signals from said central processing unit to provide advisory information;

a device data bus for receiving and transferring digital data from said central processing unit in an output direction only;

counter means incorporated in said central processing unit and operable in a count mode and a stop mode, said counter means being operable responsive to a start signal to provide a count sequence of digital data signals corresponding in number and code configuration to the predetermined number of distinct digital data input signals provided by said device, and said counter means being operable responsive to a stop signal to provide signals representative of the digital data signals that are active when said counter means is stopped;

data transfer bus means operable in a first mode for interconnecting said counter means to said device data bus for transfer of counter signals to said device and operable in a second mode for interconnecting said processor bus to said device data bus for transfer of processor output signals to said device, said data transfer bus means having bus drive means to drive said device data bus so that digital data from said counter means in said first mode and from said processor bus in said second mode is transferred via said device data bus in an output direction only from said central processing unit to said device, thereby making said device data bus unavailable for transfer of digital data in an input direction from said device to said central processing unit;

comparator means in said device, said comparator means being operable to compare the count sequence of digital data signals received from said counter means via said device data bus when said counter means is in a count mode and said data transfer bus means is in said first mode of operation and digital data signals provided by said device when activated, respectively, and said comparator means having a single input signal line interconnected from said device to said counter means in said central processng unit and said comparator means being further operable to provide an input signal via said single input signal line to change the state of said counter means from a count mode to a stop mode when digital data signals from said counter means and digital data signals from said device are identical whereby said counter means is stopped in a count state representative of a particular one of said distinct digital data signals currently activated at said device thereby accomplishing transfer of the digital data from said device in an input direction to said central processing unit by utilizing only said single input signal line and whereupon the state of said counter means and accordingly the identity of the particular one of said distinct digital data signals currently activated can be determined by said central processing unit;

advisory selection and operating means responsive to digital data signals supplied by said central processing unit via said processor bus and said device data bus when said data transfer bus means is in said second mode of operation for selectively operating said advisory unit in accordance with status information and the like from said central processing unit.

2. The system of claim 1 wherein said status information is representative of digital data signals provided by said device.

3. The system of claim 1 further comprising:

device interrupt generation logic for analyzing and confirming valid entries of said keyboard signals and for providing at least one interrupt signal to said central processing unit.

4. An information transfer system, said system utilizing digital data to represent information, said digital data being represented by coded characters, each character comprising a predetermined plurality of binary digital signals transferred in parallel in said system, said system incorporating a central processing unit having facilities for processing said digital data and for supplying digital data processor output signals indicative of status signals and the like and responding to digital data input signals in said system, and said system requiring transfer of said digital data in both an output direction from said central processing unit and in an input direction to said central processing unit, said central processing unit having a processor bus for transferring the predetermined digital data in said system, said system comprising:

a device externally located from said central processing unit, said device having an entry unit with a predetermined number of entry means for entering digital data, each of said entry means having associated entry switch means selectively settable to represent particular coded characters in said system and said entry means and associated switch means being activatable by an operator to provide digital data signals for input to said central processing unit representative of the entry means activated by said operator and said device further comprising a selectively operable advisory unit, said advisory unit being responsive to digital data output signals from said central processing unit to provide advisory information to said operator;

a device data bus for receiving and transferring digital data from said central processing unit in an output direction only;

counter means incorporated in said central processing unit and operable in a count mode and a stop mode, said counter means being operable responsive to a start signal to provide a count sequence of digital data signals corresponding in number and code configuration to said entry means in said device, and said counter means being operable responsive to a stop signal to provide signals representative of the digital data signals that are active when said counter means is stopped;

data transfer bus means operable in a first mode for interconnecting said counter means to said device data bus for transfer of counter signals to said device and operable in a second mode for interconnecting said processor bus to said device data bus for transfer of processor output signals to said device, said data transfer bus means having bus drive means to drive said device data bus so that digital data from said counter means in said first mode and from said processor bus in said second mode is transferred via said device data bus in an output direction only from said central processing unit to said device, thereby making said device data bus unavailable for transfer of digital data in an input direction from said device to said central processing unit;

entry bus means in said device including an entry bus connected to said entry unit for transmitting digital data signals within said device from said entry switch means as another source of digital data code signals;

comparator means in said device, said comparator means being operable to compare the count sequence of digital data signals received from said counter means via said device data bus when said counter means is in a count mode and said data transfer bus means is in said first mode of operation and digital data signals received from said entry switch means via said entry bus, respectively, and said comparator means having a single input signal line interconnected from said device to said counter means in said central processing unit and said comparator means being further operable to provide an input signal via said single input signal line to change the state of said counter means from a count mode to a stop mode when digital data signals from said counter means and digital data signals from said entry switch means are identical whereby said counter means is stopped in a count state representative of an entry means currently activated at said device thereby accomplishing transfer of the digital data from said entry means in said device in an input direction to said central processing unit by utilizing only said input signal line and whereupon the state of said counter means and accordingly the identity of the entry means currently activated can be determined by said central processing unit; and advisory selection and operating means responsive to digital data signals supplied by said central processing unit via said processor bus and said device data bus when said data transfer bus means is in said second mode of operation for selectively operating said advisory unit in said device in accordance with status information from said central processing unit.

5. The system of claim 4 wherein said entry unit comprises a keyboard unit, said entry means comprise entry keys, and wherein said input signal device is a single key depression signal line.

6. The system of claim 4, further comprising:
device interrupt generation logic interconnected with said counter means and a pair of counters cooperatively connected together and further including counter logic means operable to establish a first count interval and a second count interval, said pair of counters being operable during said first count interval to provide a signal to said central processing unit to indicate that the entry switch means in said entry unit is correctly activated to thereby confirm the entry of digital data signals and to serve as an interrupt signal to said central processing unit and said counters being operable during said second count interval to provide a sufficient time for said central processing unit to detect said entry of digital data signals from said entry unit.

7. An information transfer system, said system utilizing digital data to represent information, said digital data being represented by coded characters, each character comprising a predetermined plurality of binary digital signals transferred in parallel in said system, said system incorporating a central processing unit having facilities for processing said digital data and for supplying digital data processor output signals indicative of status signals and the like and responding to digital data input signals in said system, and said system requiring transfer of said digital data in both an output direction from said central processing unit and in an input direction to said central processing unit, said central processing unit having a processor bus for transferring the predetermined digital data in said system, said system comprising:

a device externally located from said central processing unit, said device having an entry unit with a predetermined number of entry means for entering digital data, each of said entry means having associated entry switch means selectively settable to represent particular coded characters in said system and said entry means and associated switch means being activatable by an operator to provide digital data signals for input to said central processing unit representative of the entry means activated by said operator and said device further comprising a selectively operable advisory unit, said advisory unit having visual indicator means responsive to processor output signals from said central processing unit to provide advisory information to said operator and said advisory unit further having audible signal means operable in response to selected ones of said processor output signals from said central processing unit;

a device data bus for receiving and transferring digital data from said central processing unit in an output direction only;

counter means incorporated in said central processing unit and operable in a count mode and a stop mode, said counter means being operable responsive to a start signal to provide a count sequence of digital data signals corresponding in number and code configuration to said entry means in said device, and said counter means being operable responsive to a stop signal to provide signals representative of the digital data signals that are active when said counter means is stopped;

data transfer bus means operable in a first mode for interconnecting said counter means to said device data bus for transfer of counter signals to said device and operable in a second mode for interconnecting said processor bus to said device data bus for transfer of processor output signals to said device, said data transfer bus means having bus drive means to drive said device data bus so that digital data from said counter means in said first mode and from said processor bus in said second mode is transferred via said device data bus in an output direction only from said central processing unit to said device, thereby making said device data bus unavailable for transfer of digital data in an input direction from said device to said central processing unit;

entry bus means in said device including an entry bus connected to said entry unit for transmitting digital data signals within said device from said entry switch means as another source of digital data code signals;

comparator means in said device, said comparator means being operable to compare the count sequence of digital data signals received from said counter means via said device data bus when said counter means is in a count mode and said data transfer bus means is in said first mode of operation and digital data signals received from said entry switch means via said entry bus means, respectively, and said comparator means having a single input signal line interconnected from said device to said counter means in said central processing unit and said comparator means being further operable to provide an input signal via said single input signal line to change the state of said counter means from a count mode to a stop mode when digital data signals from said counter means and digital data signals from said entry switch means are identical whereby said counter means is stopped in a count state representative of an entry means currently activated at said device thereby accomplishing transfer of the digital data from said entry means in said device in an input direction to said central processing unit by utilizing only said input signal line and whereupon the state of said counter means and accordingly the identity of the entry means currently activated can be determined by said central processing unit;

interrupt generation logic interconnected with said central processing unit including an exclusive or circuit responsive to digital data signals from said device upon each activation thereof to supply a first interrupt signal to inform said central processing unit of such activation and said interrupt generation logic being further responsive to deactivation of said device and termination of said digital data signals to supply a second interrupt signal to inform said central processing unit of such deactivation; and advisory selection and operating means operable under control of said central processing unit via said processor bus and said data transfer bus in response to said first interrupt signal from said interrupt generation logic and when said data transfer bus means is in said second mode of operation for selectively operating said visual indicators and said audible signal means in said advisory unit to convey both visual and audible indications in accordance with status information from said central processing unit, the operation of said audible signal means thereby confirming that digital data signals from said device have been received by said central processing unit, said advisory selection and operating means being further operable under control of said central processing unit in response to said second interrupt signal from said interrupt generation logic for terminating operation of said audible signal means in said advisory unit.

8. The system of claim 7, wherein said externally located device comprises an operator console, wherein each of said entry means has associated switch means arranged in rows and columns wherein said counter means comprises a recirculating counter and wherein comparator means has row logic and column logic correlated with the rows and columns of said switch means for comparing the count signal sequence from said counter means and the digital data signals from said switch means.

* * * * *